United States Patent
Chou

(10) Patent No.: US 8,427,889 B2
(45) Date of Patent: Apr. 23, 2013

(54) MEMORY DEVICE AND ASSOCIATED MAIN WORD LINE AND WORD LINE DRIVING CIRCUIT

(75) Inventor: Min Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 391 days.

(21) Appl. No.: 12/713,708

(22) Filed: Feb. 26, 2010

(65) Prior Publication Data
US 2011/0211398 A1    Sep. 1, 2011

(51) Int. Cl.
*G11C 7/00* (2006.01)

(52) U.S. Cl.
USPC ..................................... 365/189.11

(58) Field of Classification Search ............... 365/189.11
See application file for complete search history.

(56) References Cited

U.S. PATENT DOCUMENTS

| | | | |
|---|---|---|---|
| 5,363,338 A * | 11/1994 | Oh | 365/230.06 |
| 5,602,796 A | 2/1997 | Sugio | |
| 7,023,738 B2 * | 4/2006 | Vimercati et al. | 365/185.23 |
| 7,710,795 B2 * | 5/2010 | Kang | 365/189.07 |
| 2002/0141277 A1 * | 10/2002 | Inaba et al. | 365/230.06 |
| 2004/0228192 A1 * | 11/2004 | Tedrow et al. | 365/202 |
| 2008/0043540 A1 * | 2/2008 | Boemler | 365/189.11 |
| 2010/0302880 A1 * | 12/2010 | Wang et al. | 365/189.11 |
| 2011/0199837 A1 * | 8/2011 | Reohr et al. | 365/189.06 |

* cited by examiner

*Primary Examiner* — Hoai V Ho
*Assistant Examiner* — Min Huang
(74) *Attorney, Agent, or Firm* — WPAT, P.C.; Anthony King

(57) ABSTRACT

A main word line driving circuit for driving word lines in a memory device comprises first and second level shifting units and an inverting unit. The first level shifting unit is configured to convert a decode signal into a first operative signal, and the second level shifting unit is configured to convert the decode signal into a second operative signal. The inverting unit is configured to receive the first and second operative signals. A supply voltage of the first level shifting unit is selectively switched to a first bias voltage when the plurality of word lines are selected or partially selected and switched the output voltage to a second bias voltage when the plurality of word lines are deselected.

4 Claims, 4 Drawing Sheets

MEMORY DEVICE AND ASSOCIATED MAIN WORD LINE AND WORD LINE DRIVING CIRCUIT

BACKGROUND OF THE INVENTION

1. Field of the Invention

The present invention relates to a memory device and associated main word line and word line driving circuit.

2. Description of the Related Art

Semiconductor memory devices are devices in which data can be stored and from which the stored data can be retrieved. Semiconductor memory devices can be classified into random access memory (RAM) and read only memory (ROM). RAM is a volatile memory that needs power supply to retain data. ROM is a nonvolatile memory that can retain data even when power is removed. Examples of RAM are a dynamic RAM (DRAM) and a static RAM (SRAM). Examples of ROM are a programmable ROM (PROM), an erasable PROM (EPROM), an electrically EPROM (EEPROM), and a flash memory.

A semiconductor memory device comprises a cell array with a plurality of memory cells. Each of the memory cells is connected to a word line and a bit line. The semiconductor memory device includes a word line driving circuit for supplying a word line voltage to a selected word line. FIG. 1 shows a circuit 10 for driving a word line 110 disclosed in U.S. Pat. No. 7,023,738. Referring to FIG. 1, the circuit 10 comprises two level shifters 120s, 120g and a selector 140. The level shifter 120s is used to boost up logic high/low level $V_{DD}/V_{SS}$ of a selection signal SD to bias voltages $V_{PP}/V_{BB}$, and the level shifter 120g is used to boost up logic high/low level $V_{DD}/V_{SS}$ of a selection signal GD to bias voltages $V_{PP}/V_{BB}$. The level shifters 120s and 120g are implemented by two cascaded stages. The selector 140 is used to apply a control signal GP from the level shifter 120g to the word line 110 according to a supply signal SP from the level shifter 120s.

An important requirement of current memory device design is low power consumption. This requirement is especially important for use in mobile battery-powered host devices for supporting longer battery-powered operation. For saving power, a memory device enters a standby mode of operation to reduce current consumption. In the standby mode, it is desirable to keep leakage current as low as possible since the ratio of the leakage current to overall operating current increases significantly. Although U.S. Pat. No. 7,023,738 disclosed a driving circuit for a semiconductor memory device, it failed to disclose the power saving mechanism of the driving circuit. Therefore, in order to meet the requirement of the market, it is desirable to provide a driving circuit to reduce leakage current for the semiconductor memory device.

SUMMARY OF THE INVENTION

An aspect of the present invention is to provide a main word line driving circuit for driving the corresponding word lines in a memory device.

According to one embodiment of the present invention, the main word line driving circuit comprises first and second level shifting units and an inverting unit. The first level shifting unit is configured to convert a decode signal into a first operative signal, and the second level shifting unit is configured to convert the decode signal into a second operative signal. The inverting unit is configured to receive the first and second operative signals. A supply voltage of the first level shifting unit is selectively switched to a first bias voltage when the word lines in the memory device are selected or partially selected and switched to a second bias voltage when the word lines in the memory device are deselected.

Another aspect of the present invention is to provide a word line driving circuit for driving word lines in a memory device.

According to one embodiment of the present invention, the word line driving circuit comprises a plurality of sub-word line driving circuits and a main word line driving circuit. The sub-word line driving circuit is configured to convert an output signal of the main word line driving circuit into a driving signal for the word line in response to first and second activation signals. The main word line driving circuit comprises first and second level shifting units and an inverting unit. The first level shifting unit is configured to convert a decode signal into a first operative signal, and the second level shifting unit is configured to convert the decode signal into a second operative signal. The inverting unit is configured to receive the first and second operative signals. A supply voltage of the first level shifting unit is selectively switched to a first bias voltage when the word lines in the memory device are selected or partially selected and switched to a second bias voltage when the word lines in the memory device are deselected.

Another aspect of the present invention is to provide a memory device.

According to one embodiment of the present invention, the memory device comprises a plurality of memory cells, a plurality of word lines, a plurality of sub-word line driving circuits, a multiplexer, and a plurality of main word line driving circuits. The plurality of word lines are connected to the plurality of memory cells and the plurality of sub-word line driving circuits are connected to the plurality of word lines. The multiplexer is configured for selectively switching an output voltage to a first bias voltage when the plurality of word lines are selected or partially selected and switching the output voltage to a second bias voltage when the plurality of word lines are deselected. The main word line driving circuit comprises first and second level shifting units and an inverting unit. The first level shifting unit is configured to receive the output voltage of the multiplexer and to convert a decode signal into a first operative signal, and the second level shifting unit is configured to convert the decode signal into a second operative signal. The inverting unit is configured to receive the first and second operative signals and generate an output signal to the sub-word line driving circuit.

BRIEF DESCRIPTION OF THE DRAWINGS

The invention will be described according to the appended drawings in which.

DETAILED DESCRIPTION OF THE INVENTION

Figure 2:
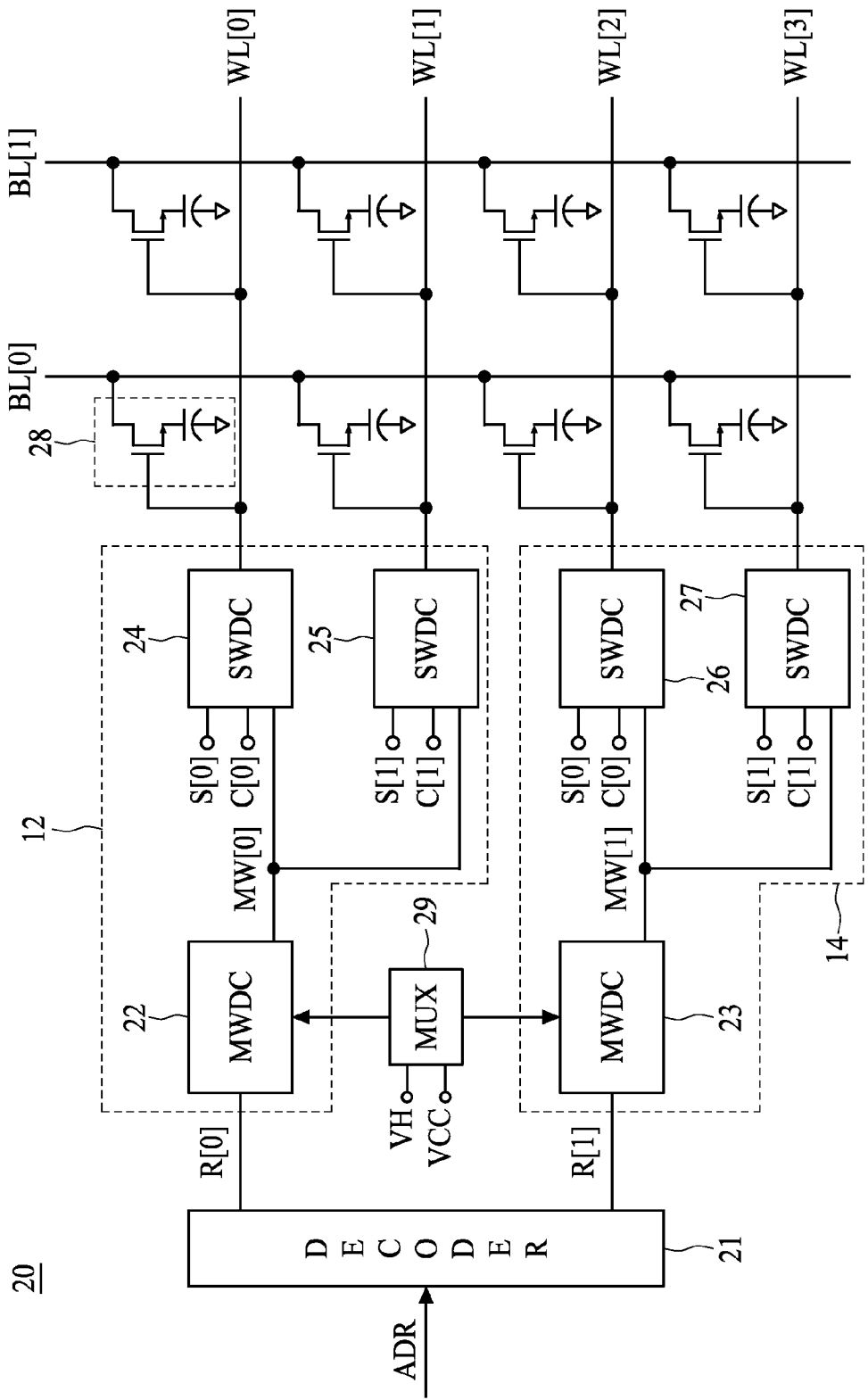
FIG. 2 shows a portion of a memory device according to one embodiment of the present invention.

FIG. 2 shows a portion of a memory device 20 according to one embodiment of the present invention. The memory device 20 comprises a plurality of memory cells 28, a plurality of word lines WL[0]-WL[3], word line driving circuits 12 and 14, and a multiplexer MUX 29. Referring to FIG. 2, the word line driving circuit 12 comprises a main word line driving circuit MWDC 22 and two sub-word line driving circuits SWDC 24 and 25, and the word line driving circuit 14 comprises a main word line driving circuit MWDC 23 and two sub-word line driving circuits SWDC 26 and 27. The multiplexer MUX 29 is configured for selectively switching an output voltage between the bias voltages VH and VCC. The plurality of word lines WL[0]-WL[3] are respectively connected to the gates of the corresponding memory cells 28 for controlling memory cells 28, and the voltages of the word lines WL[0]-WL[3] are provided from the sub-word line driving circuits SWDC 24-27.

Referring to FIG. 2, the decoder 21 receives a row address ADR and decodes the ADR into a group of decode signals R[0], R[1]. The circuits MWDC 22, 23 are configured to convert the decode signals R[0], R[1] into select signals MW[0], MW[1], then transmit the select signals MW[0], MW[1] to the corresponding sub-word line driving circuits SWDC. The sub-word line driving circuits SWDC 24-27 are configured to convert the select signals MW[0], MW[1] to word lines WL[0]-WL[3] in response to first word line activation signals S[0]-S[1] and second word line activation signals C[0]-C[1].

Figure 3:
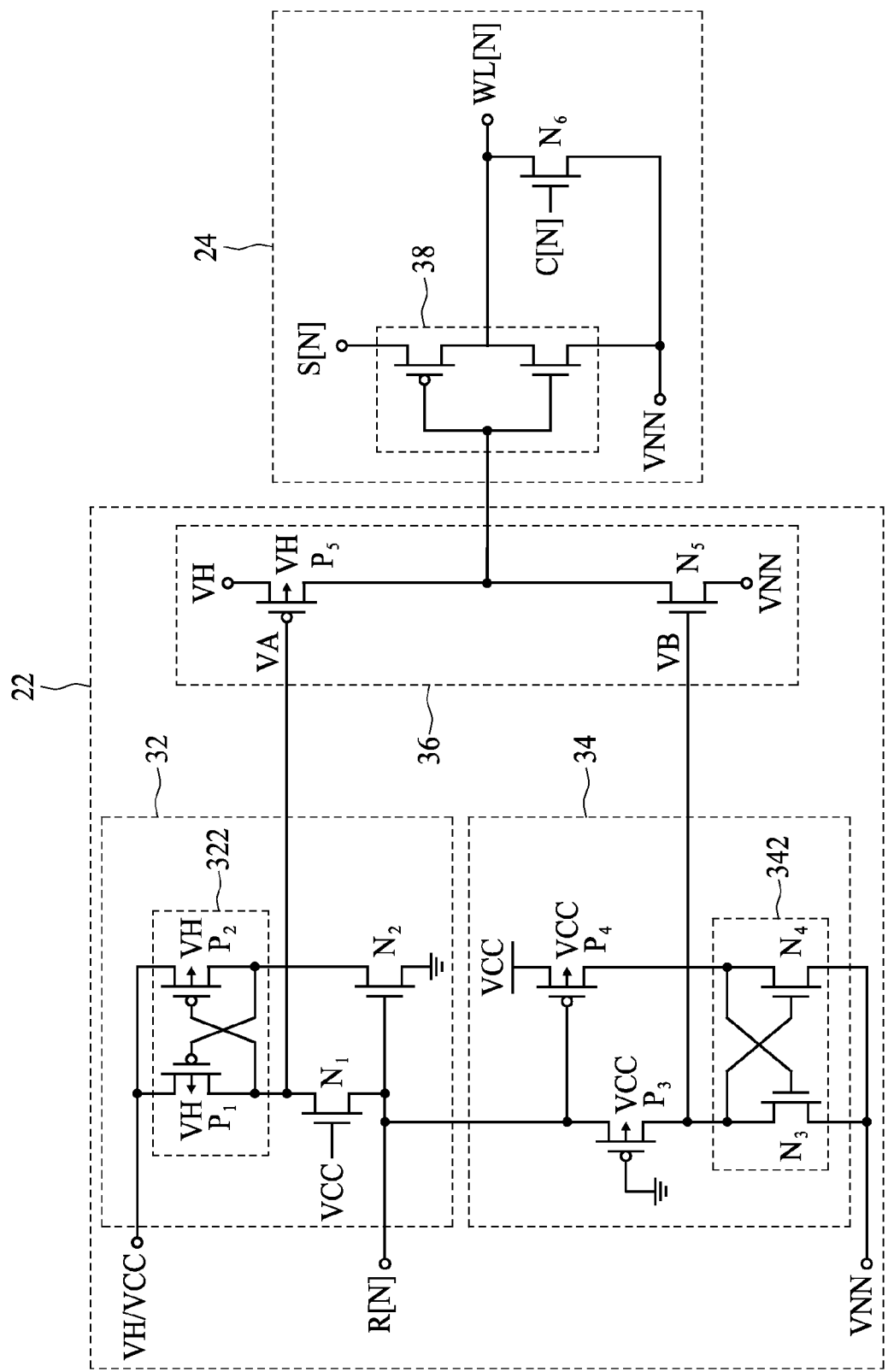
FIG. 3 shows a block diagram of the main word line driving circuit and the sub-word line driving circuit according to one embodiment of the present invention.

FIG. 3 shows block diagrams of the MWDC 22 and the SWDC 24 according to one embodiment of the present invention, wherein the MWDC 22 comprises level shifting units 32, 34 and an inverting unit 36. The level shifting unit 32 is configured to shift one of the logic levels of the decode signal R[N] to bias voltages VH or VCC, and the level shifting unit 34 is configured to shift one of the logic levels of the decode signal R[N] to the bias voltage VNN. The inverting unit 36, composed of an NMOS transistor $N_5$ and a PMOS transistor $P_5$, receives output signals, VA and VB, of the level shifting units 32, 34 and outputs a signal to the circuit SWDC 24.

Referring to FIG. 3, the level shifting unit 32 comprises a latching unit 322 and NMOS transistors $N_1$, $N_2$, wherein the latching unit 322 comprises two cross-coupled PMOS transistors $P_1$ and $P_2$. The transistor $N_1$ has a gate connected to a bias voltage VCC, a source connected for receiving the decode signal R[N], and a drain connected to the latching unit 322. The transistor $N_2$ has a gate connected for receiving the decode signal R[N], a source connected to a bias voltage GND, and a drain connected to the latching unit 322. The level shifting unit 34 comprises a latching unit 342 and PMOS transistors $P_3$, $P_4$, wherein the latching unit 342 comprises two cross-coupled NMOS transistors $N_3$ and $N_4$. The transistor $P_3$ has a gate connected to the bias voltage GND, a source connected for receiving the decode signal R[N], and a drain connected to the latching unit 342. The transistor $P_4$ has a gate connected for receiving the decode signal R[N], a source connected to the bias voltage VCC, and a drain connected to the latching unit 342.

Referring to FIG. 3, the SWDC 24 comprises an inverter 38 and an NMOS transistor $N_6$. The inverter 38 receives the output signal of the circuit MWDC 22, receives the first word line activation signal S[N] as a supply signal, and provides a voltage to a word line WL[N]. The NMOS transistor $N_6$ has a gate connected to the second world line activation signal C[N], a drain connected to the word line WL[N], and a source connected to the bias voltage VNN. The second word line activation signal C[N] is opposite to the first word line activation signal S[N].

The operation mechanism of the memory device 20 is described as follows. When the decode signal R[0] having a logic high level $V_{CC}$ is applied to the input of the MWDC 22, one of the word lines WL[0]-WL[1] is selected according to the first word line activation signals S[0]-S[1] and the second word line activation signals C[0]-C[1]. In this case, the MUX 29 in FIG. 2 selects the bias voltage VH to provide power to the circuits MWDC 22 and MWDC 23. The PMOS transistors $P_1$, $P_2$ of the latching unit 322 in the circuit MWDC 22 turn on and off, respectively, and thus the drain voltage of the PMOS transistor $P_2$ is equal to the bias voltage GND.

Figure 1:
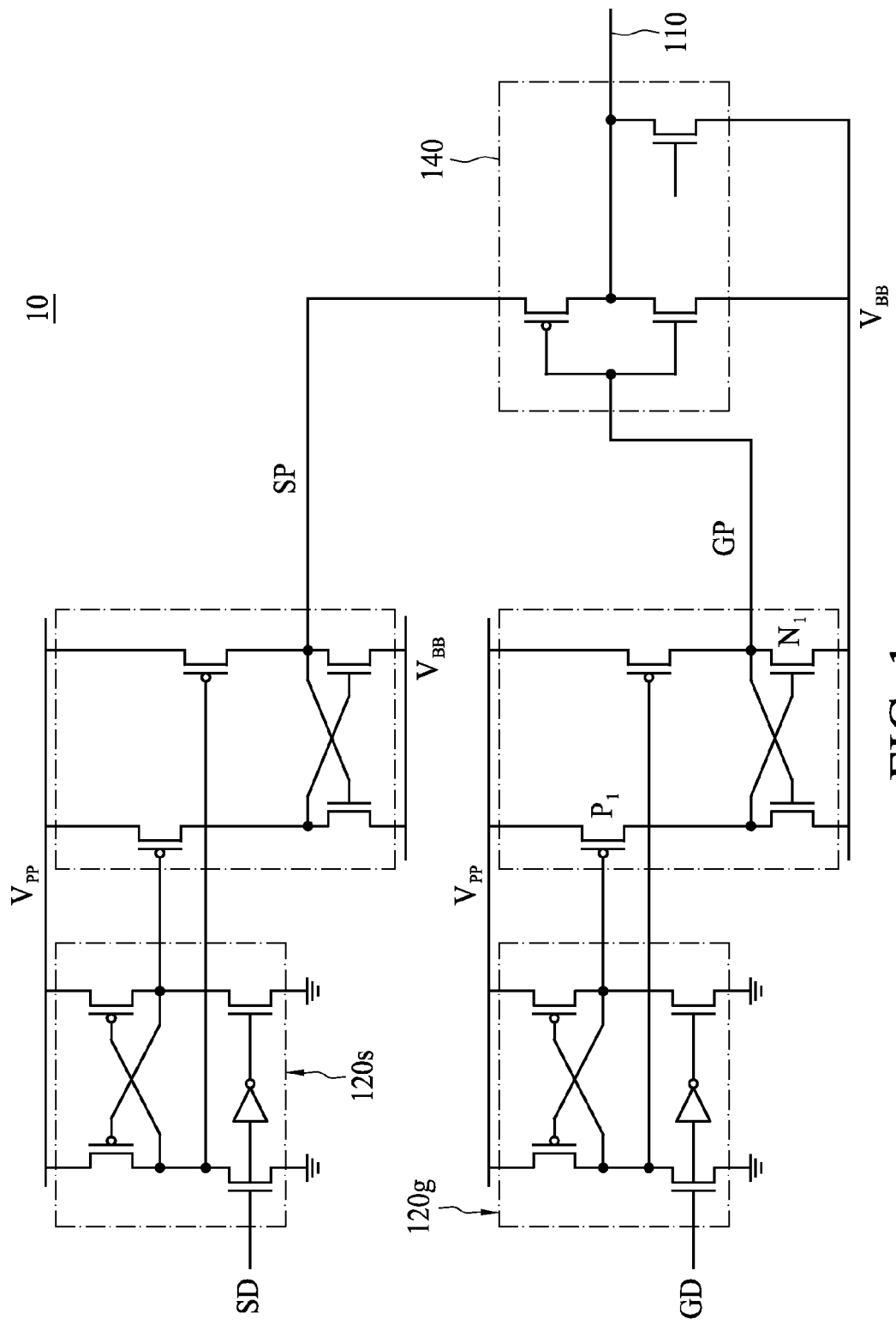
FIG. 1 shows a circuit for driving a word line disclosed in U.S. Pat. No. 7,023,738.
Figure 4A:
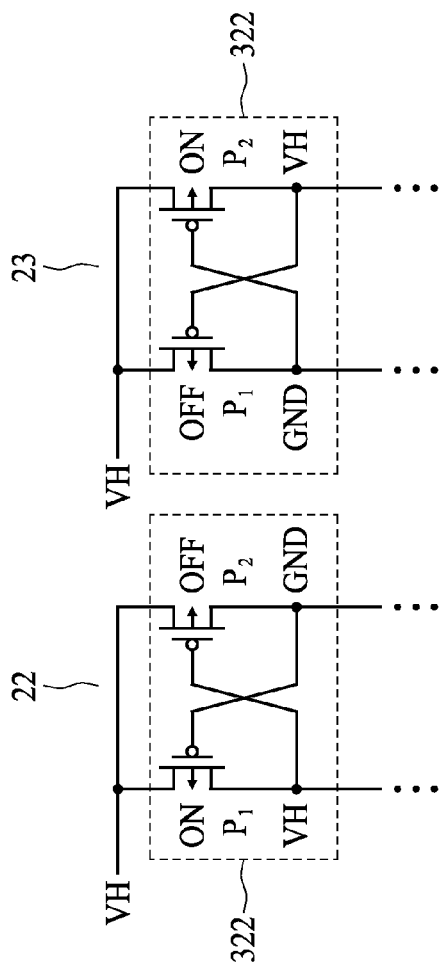
FIGS. 4A and 4B show the operation mechanism of the memory device.

Alternatively, when the decode signal R[0] having the logic high level $V_{CC}$ is applied to the input of the MWDC 22 while the decode signal R[1] having a logic low level GND is applied to the input of the MWDC 23, one of the word lines WL[0]-WL[1] is selected according to the first word line activation signals S[0]-S[1] and the second word line activation signals C[0]-C[1] while the word lines WL[2]-WL[3] are deselected regardless of the first word line activation signals S[0]-S[1] and the second word line activation signals C[0]-C[1]. In this case, the MUX 29 selects the bias voltage VH to provide power to the circuits MWDC 22 and MWDC 23. Referring to FIG. 4A, the PMOS transistors $P_1$, $P_2$ of the latching unit 322 in the circuit MWDC 22 turn on and off, respectively and the PMOS transistors $P_1$, $P_2$ of the latching unit 322 in the circuit MWDC 23 turn off and on, respectively. The voltage difference between the source and the drain of the PMOS transistor $P_1$ in the circuit MWDC 23 is equal to VH minus GND, which is relatively lower than the voltage difference (equal to $V_{PP}$ minus $V_{BB}$) between the source and the drain of the PMOS transistor $P_1$ in FIG. 1 when the selection signal GD is at a logic high level. In addition, the voltage difference between the source and the drain of the NMOS transistor $N_3$ in the circuit MWDC 23 is equal to VCC minus VNN, which is relatively lower than the voltage difference (equal to $V_{PP}$ minus $V_{BB}$) between the source and the drain of the NMOS transistor $N_1$ in FIG. 1 when the selection signal GD is at a logic high level.

Figure 4B:
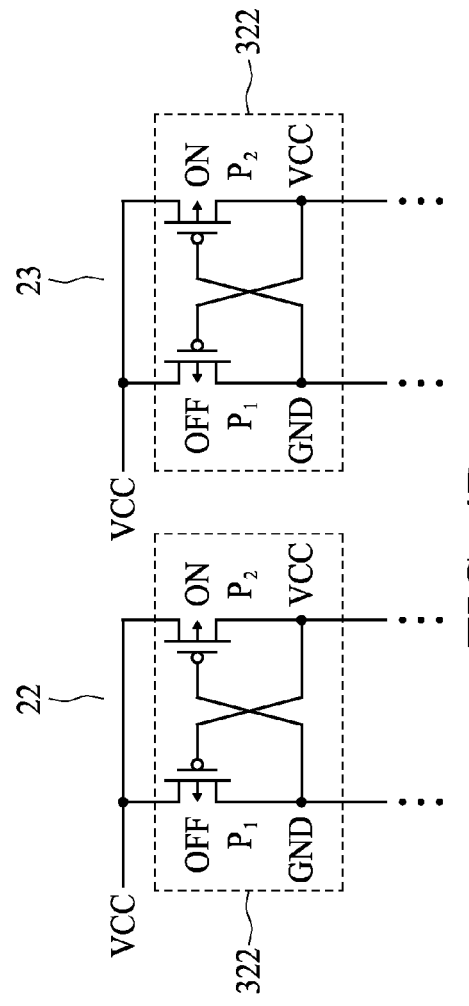

Alternatively, when the decode signals R[0] and R[1] having the logic low level GND are applied to the inputs of the MWDC 22 and MWDC 23, regardless of the first and second word line activation signals S[0]-S[1] and C[0]-C[1], the word lines WL[0]-WL[3] are deselected and thus the memory device 20 enters a standby mode for saving power. In this case, the MUX 29 selects the bias voltage VCC to provide power to the circuits MWDC 22 and MWDC 23. Referring to FIG. 4B, the PMOS transistors $P_1$, $P_2$ of the latching unit 322 in the circuit MWDC 22 turn off and on, respectively, and the PMOS transistors $P_1$, $P_2$ of the latching unit 322 in the circuit MWDC 23 turn off and on, respectively. The voltage differences between the source and the drain of the PMOS transistor $P_1$ in the circuits MWDC 22 and MWDC 23 are equal to VCC minus GND, which is relatively lower than the voltage difference (equal to $V_{PP}$ minus $V_{BB}$) between the source and the drain of the PMOS transistor $P_1$ in FIG. 1.

When the voltage difference between a source and a drain of a MOSFET having an OFF state is relatively high, a junction leakage current called gate-induced drain leakage (GIDL) current comes to flow in the PN junction, which results in an increased leakage current. Such leakage current can be ignored when the memory device operates in an active mode since the current requirement in this mode is higher. However, when the memory device operates in a standby mode, the current requirement is strict for saving power. Therefore, by selectively switching a voltage provided to the word line driving circuit, the present inventions reduces power consumption significantly in standby mode and thus improves the efficiency of the memory device.

The above-described embodiments of the present invention are intended to be illustrative only. Numerous alternative embodiments may be devised by those skilled in the art without departing from the scope of the following claims.

What is claimed is:

1. A main word line driving circuit for driving word lines in a memory device, comprising:
   a first level shifting unit configured to convert a decode signal into a first operative signal, wherein the first level shifting unit comprising:
   a latching unit;
   a first NMOS transistor having a gate connected to a second bias voltage, a source connected for receiving the decode signal, and a drain connected to the latching unit; and
   a second NMOS transistor having a gate connected for receiving the decode signal, a source connected to a third bias voltage, and a drain connected to the latching unit;
   a second level shifting unit configured to convert the decode signal into a second operative signal; and
   an inverting unit configured to receive the first and second operative signals for driving the word lines;
   wherein a supply voltage of the first level shifting unit is selectively switched to a first bias voltage when the word lines in the memory device are selected or partially selected and switched to the second bias voltage regardless of a first word line activation signal and a second word line activation signal when the word lines in the memory device are deselected.

2. The main word line driving circuit of claim 1, wherein the second level shifting unit comprises:
   a latching unit;
   a first PMOS transistor having a gate connected to the third bias voltage, a source connected for receiving the decode signal, and a drain connected to the latching unit; and
   a second PMOS transistor having a gate connected for receiving the decode signal, a source connected to the second bias voltage, and a drain connected to the latching unit.

3. A word line driving circuit for driving word lines in a memory device, comprising:
   a sub-word line driving circuit configured to convert an output signal of a main word line driving circuit into a driving signal for the word line in response to first and second activation signals; and
   the main word line driving circuit, comprising:
   a first level shifting unit configured to convert a decode signal into a first operative signal, wherein the first level shifting unit comprising:
   a latching unit;
   a first NMOS transistor having a gate connected to a second bias voltage, a source connected for receiving the decode signal, and a drain connected to the latching unit; and
   a second NMOS transistor having a gate connected for receiving the decode signal, a source connected to a third bias voltage, and a drain connected to the latching unit;
   a second level shifting unit configured to convert the decode signal into a second operative signal; and
   an inverting unit configured to receive the first and second operative signals and then generating the output signal to the sub-word line driving circuit;
   wherein a supply voltage of the first level shifting unit is selectively switched to a first bias voltage when the word lines in the memory device are selected or partially selected and switched to the second bias voltage regardless of a first word line activation signal and a second word line activation signal when the word lines in the memory device are deselected.

4. The word line driving circuit of claim 3, wherein the second level shifting unit comprises:
   a latching unit;
   a first PMOS transistor having a gate connected to the third bias voltage, a source connected for receiving the decode signal, and a drain connected to the latching unit; and
   a second PMOS transistor having a gate connected for receiving the decode signal, a source connected to the second bias voltage, and a drain connected to the latching unit.

* * * * *